(12) United States Patent
Lee

(10) Patent No.: US 7,486,119 B2
(45) Date of Patent: Feb. 3, 2009

(54) DELAY-LOCKED LOOP CIRCUIT WITH VARIABLE BIAS VOLTAGES AND METHOD OF CLOCK SYNCHRONIZATION FOR A SEMICONDUCTOR MEMORY DEVICE

(75) Inventor: Chan-Yong Lee, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 90 days.

(21) Appl. No.: 11/481,518

(22) Filed: Jul. 6, 2006

(65) Prior Publication Data

US 2007/0018702 A1   Jan. 25, 2007

(30) Foreign Application Priority Data

Jul. 20, 2005   (KR)   .................. 10-2005-0065911

(51) Int. Cl.
*H03L 7/06* (2006.01)

(52) U.S. Cl. ...................... 327/158; 327/149

(58) Field of Classification Search .......... 327/149, 327/158
See application file for complete search history.

(56) References Cited

U.S. PATENT DOCUMENTS

| | | | |
|---|---|---|---|
| 6,275,079 B1* | 8/2001 | Park | 327/143 |
| 6,987,409 B2* | 1/2006 | Kim et al. | 327/158 |
| 2002/0180500 A1* | 12/2002 | Okuda et al. | 327/158 |
| 2003/0012322 A1* | 1/2003 | Partsch et al. | 375/376 |
| 2003/0062936 A1* | 4/2003 | Kennedy et al. | 327/158 |
| 2004/0046595 A1* | 3/2004 | Ikehashi et al. | 327/157 |
| 2004/0169537 A1* | 9/2004 | Abbasi et al. | 327/158 |
| 2005/0110537 A1* | 5/2005 | Wurzer | 327/156 |

FOREIGN PATENT DOCUMENTS

| | | |
|---|---|---|
| JP | 2001-223579 | 8/2001 |
| JP | 2001-308698 | 11/2001 |
| KR | 10-0206867 | 4/1999 |
| KR | 10-1999-0075064 | 10/1999 |

* cited by examiner

*Primary Examiner*—Kenneth B Wells
*Assistant Examiner*—Ryan C Jager
(74) *Attorney, Agent, or Firm*—F. Chau & Associates, LLC

(57) ABSTRACT

A delay-locked loop circuit comprising a variable voltage generator and a delay-locked loop. The variable voltage generator is configured to generate a variable bias voltage signal in response to a standby signal. The variable bias voltage signal has differing voltage levels according to operation modes. The operation modes include a standby mode and an active mode. The delay-locked loop is configured to generate an internal clock signal in response to the standby signal and the variable bias voltage signal. The internal clock signal is synchronized with an external clock signal.

18 Claims, 8 Drawing Sheets

DELAY-LOCKED LOOP CIRCUIT WITH VARIABLE BIAS VOLTAGES AND METHOD OF CLOCK SYNCHRONIZATION FOR A SEMICONDUCTOR MEMORY DEVICE

CROSS-REFERENCE TO RELATED APPLICATIONS

This application claims priority to Korean Patent Application No. 2005-65911, filed on Jul. 20, 2005, in the Korean Intellectual Property Office, the disclosure of which is incorporated by reference herein.

BACKGROUND OF THE INVENTION

1. Technical Field

The present disclosure relates to a delay-locked loop circuit and a method of clock synchronization, and more particularly to a delay-locked loop circuit integrated in a semiconductor memory device and a method of clock synchronization for the semiconductor memory device.

2. Discussion of the Related Art

FIG. 1 is a block diagram illustrating a conventional delay-locked loop circuit. Referring to FIG. 1, a delay-locked loop (DLL) 100 includes a phase detector 110, a charge pump 120, a variable delay line (VDL) 130, and a delay compensation circuit 140. The phase detector 110 detects a phase difference between an external clock signal CLK_IN and an internal clock signal CLK_OUT to generate an up-signal UP or a down-signal DOWN based on the phase difference. The charge pump 120 generates a delay control signal VCON in response to one of the up-signal UP and the down-signal DOWN. The variable delay line 130 generates the internal clock signal CLK_OUT that is synchronized with the external clock signal CLK_IN. The delay compensation circuit 140 compensates for a phase delay of the internal clock signal CLK_OUT due to a propagation delay through a data path (not shown), and provides the phase detector 110 with the compensated clock signal as a feedback signal SFEED.

A semiconductor memory device, such as a dynamic random-access memory (DRAM), needs a much smaller current to operate in a power-down mode or a self-refresh mode than in an active mode. When the semiconductor memory device operates in the power-down mode or the self-refresh mode, the delay-locked loop of the semiconductor memory device also needs to be operated with a smaller current than in an active mode.

Therefore, there is a need for a delay-locked loop with an adjustable operation current according to operation modes of the semiconductor memory device.

SUMMARY OF THE INVENTION

An exemplary embodiment of the invention provides a delay-locked loop circuit including a variable voltage generator and a delay-locked loop. The variable voltage generator is configured to generate a variable bias voltage signal in response to a standby signal. The variable bias voltage signal has differing voltage levels according to operation modes. The operation modes include a standby mode and an active mode. The delay-locked loop is configured to generate an internal clock signal in response to the standby signal and the variable bias voltage signal. The internal clock signal is synchronized with an external clock signal.

The variable voltage generator may include a reference voltage generating unit and a driving unit. The reference voltage generating unit is configured to generate a reference voltage, and the driving unit is configured to generate the variable bias voltage signal.

The delay-locked loop may include a phase detector, a charge pump, and a variable delay line. The phase detector may detect a phase difference between the external clock signal and the internal clock signal in response to the standby signal to generate an up-down signal corresponding to the phase difference. The charge pump may generate a delay control signal in response to the up-down signal and the standby signal. The variable delay line may be configured to generate the internal clock signal depending on the variable bias voltage signal in response to the external clock signal and the delay control signal.

In addition, the delay-locked loop may further include a delay compensation circuit that may compensate for a phase delay of the internal clock signal, and which is configured to generate a feedback signal corresponding to an amount of the compensation of the phase delay to provide the feedback signal to the phase detector.

The delay-locked loop may further include an interpolator that may interpolate two adjacent clock signals that are selected among a plurality of output clock signals of the variable delay line in response to the variable bias voltage signal, and configured to generate the interpolated signal as the internal clock signal.

In an exemplary embodiment of the invention, a semiconductor memory device includes a variable voltage generator and a delay-locked loop. The variable voltage generator is configured to generate a variable bias voltage signal in response to a standby signal. The variable bias voltage signal has different voltage levels according to operation modes. The operation modes include a standby mode and an active mode. The delay-locked loop is configured to generate an internal clock signal in response to the standby signal and the variable bias voltage signal. The internal clock signal is synchronized with an external clock signal.

An exemplary embodiment of the invention provides a method of clock synchronization for a semiconductor memory device. The method includes generating a variable bias voltage signal, which has different voltage levels according to operation modes, in response to a standby signal, in which the operation modes include a standby mode and an active mode, and generating an internal clock signal in response to the standby signal and the variable bias voltage signal, in which the internal clock signal is synchronized with an external clock signal.

Generating the variable bias voltage signal may include generating a reference voltage, and generating the variable bias voltage signal in response to the reference voltage and the standby signal.

Generating the internal clock signal may include detecting a phase difference between the external clock signal and the internal clock signal in response to the standby signal to generate an up-down signal corresponding to the phase difference, generating a delay control signal in response to the up-down signal and the standby signal, generating output clock signals depending on the variable bias voltage signal in response to the external clock signal and the delay control signal, and interpolating two adjacent two clock signals that are selected from the output clock signals to generate the interpolated signal as the internal clock signal.

BRIEF DESCRIPTION OF THE DRAWINGS

The above and other features of the present invention will become more readily apparent by describing in detail example embodiments thereof with reference to the accompanying drawings, in which.

DETAILED DESCRIPTION OF EXEMPLARY EMBODIMENTS

It will be understood that when an element or layer is referred to as being "on," "connected to" or "coupled to" another element or layer, it can be directly on, connected or coupled to the other element or layer or intervening elements or layers may be present. Like numbers refer to like elements throughout.

Hereinafter, exemplary embodiments of the present invention will be explained in detail with reference to the accompanying drawings.

Figure 1:
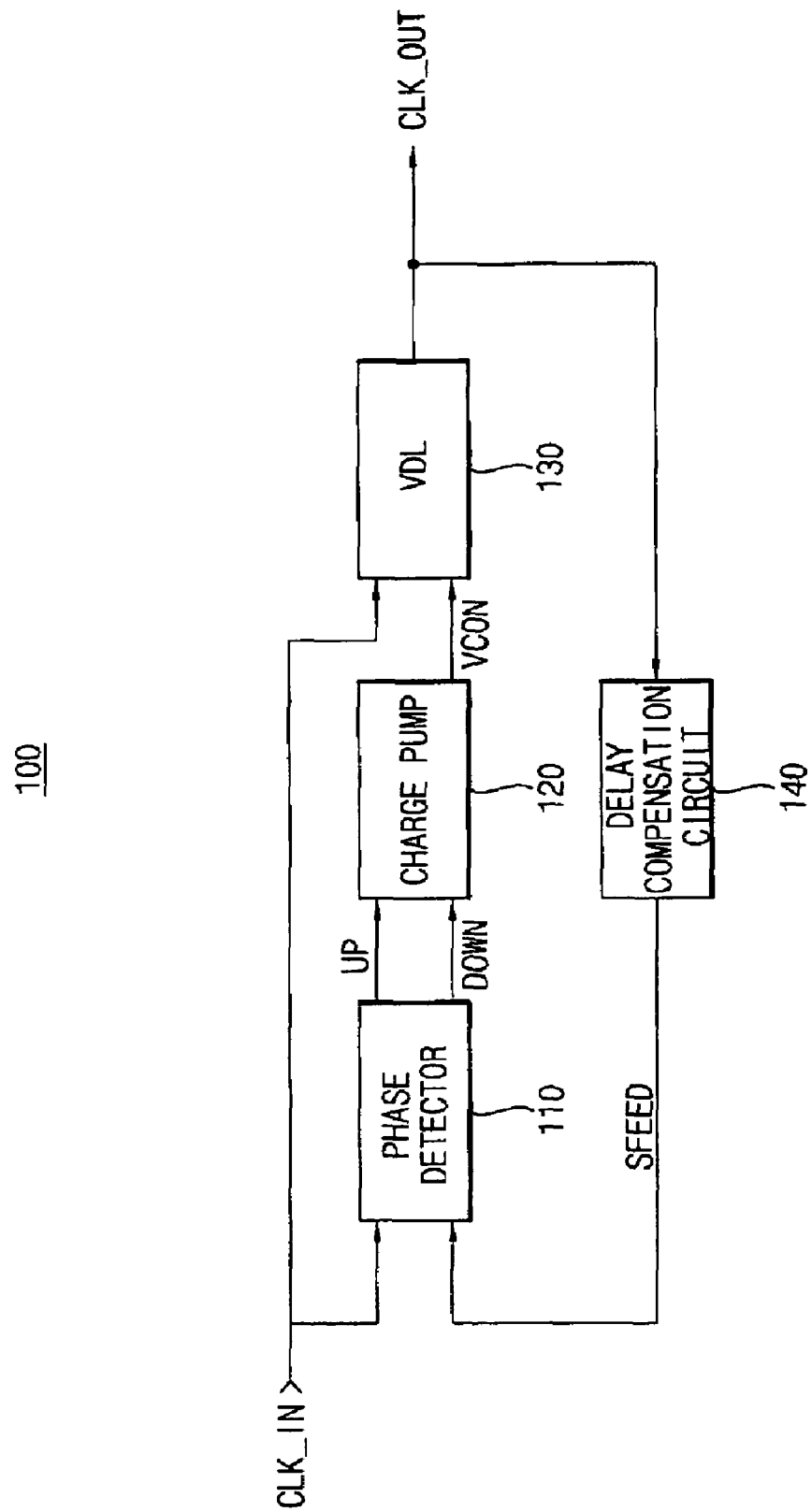
FIG. 1 is a block diagram illustrating a conventional delay-locked loop.
Figure 2:
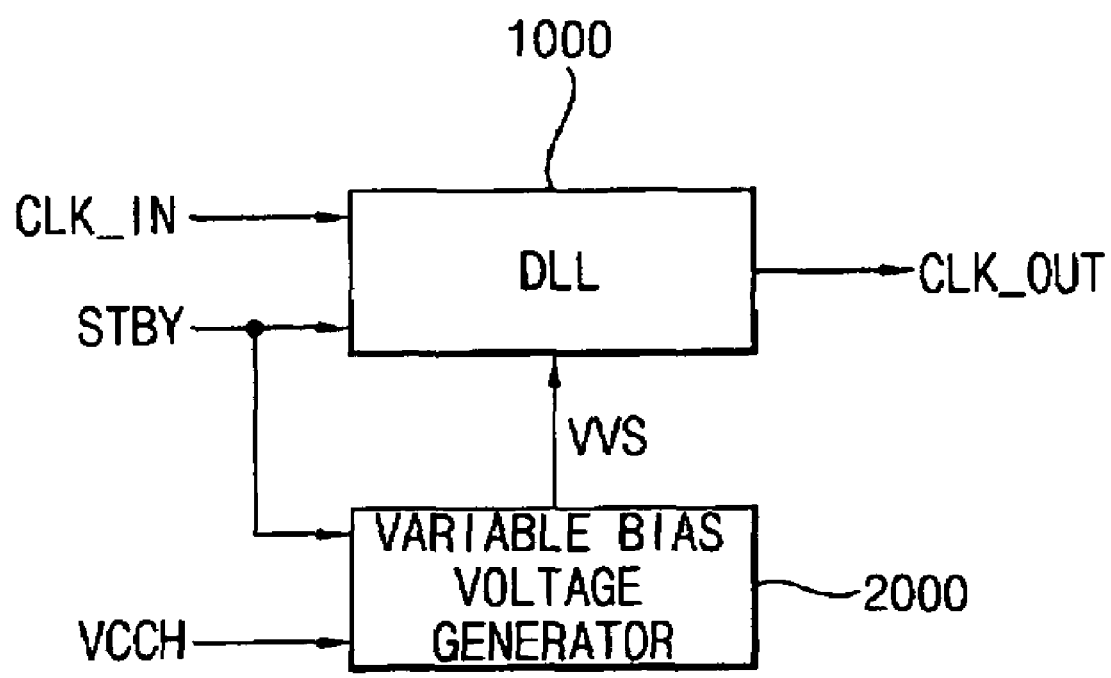
FIG. 2 is a block diagram illustrating a delay-locked loop circuit according to an exemplary embodiment of the present invention.

FIG. 2 is a block diagram illustrating a delay-locked loop circuit according to an exemplary embodiment of the invention. Referring to FIG. 2, a delay-locked loop circuit includes a variable voltage generator 2000 and a delay-locked loop 1000. The variable voltage generator 2000 generates a variable bias voltage signal VVS, which has different voltage levels according to operation modes, in response to a standby signal STBY. The delay-locked loop 1000 generates an internal clock signal CLK_OUT that is synchronized with an external clock signal CLK_IN, in response to the standby signal STBY and the variable bias voltage signal VVS. The variable voltage generator 2000 may be initialized by a power-on reset (POR) signal such as a power-up signal VCCH.

Figure 3:
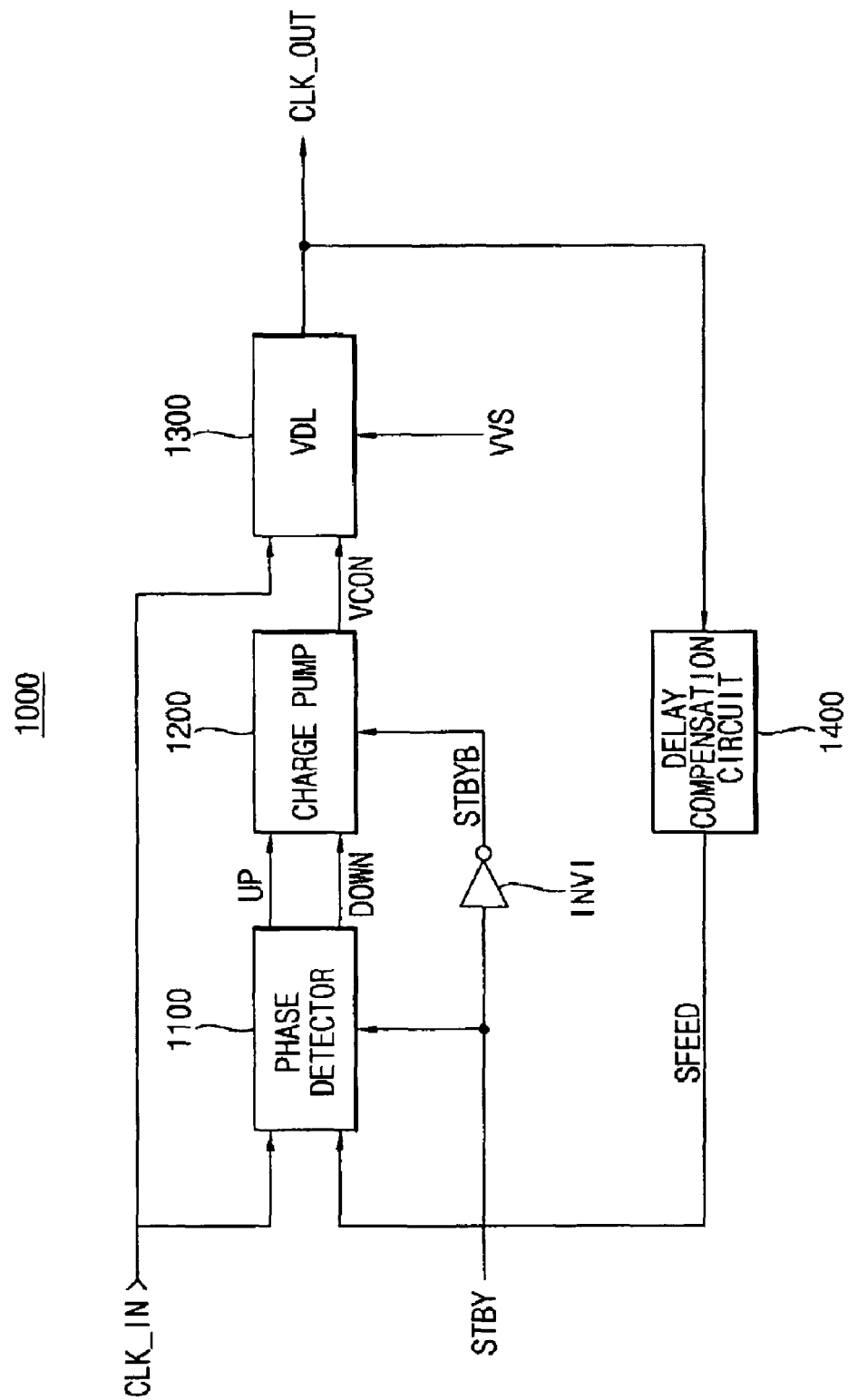
FIG. 3 is a block diagram illustrating an exemplary embodiment of the delay-locked loop illustrated in the delay-locked loop circuit in FIG. 2.

FIG. 3 is a block diagram illustrating an exemplary embodiment of a delay-locked loop illustrated in the delay-locked loop circuit in FIG. 2.

Referring to FIG. 3, the delay-locked loop 1000 includes a phase detector 1100, a charge pump 1200, a variable delay line (VDL) 1300, a delay compensation circuit 1400 and an inverter INV1. The phase detector 1100 receives the external clock signal CLK_IN and the internal clock signal CLK_OUT, and detects the phase difference between the external clock signal CLK_IN and the internal clock signal CLK_OUT, in response to the standby signal STBY. The phase detector 1100 generates an up-signal UP or a down-signal DOWN based on the detected phase difference. The inverter INV1 inverts the standby signal STBY to output an inverted standby signal STBYB. The charge pump 1200 generates a delay control signal VCON in response to the up-signal UP, the down-signal DOWN and the inverted standby signal STBYB. The variable delay line 1300 generates the internal clock signal CLK_OUT, which is synchronized with the external clock signal CLK_IN, in response to the external clock signal CLK_IN, the delay control signal VCON and the variable bias voltage signal VVS. The delay compensation circuit 1400 compensates for a phase delay of the internal clock signal CLK_OUT and provides the phase detector 1100 with a feedback signal SFEED corresponding to an amount of the compensation of the phase delay.

Hereinafter, operation of the delay-locked loop according to an exemplary embodiment of the invention will be discussed with reference to FIGS. 2 and 3.

When the standby signal STBY is activated, the semiconductor memory device operates in the standby mode. The standby mode is an operation mode that is neither an on-state where clock locking information is continuously updated, nor an off-state where previous clock locking information is completely lost and the delay-locked loop is deactivated. In the standby mode, the delay-locked loop circuit keeps the previous clock locking information but deactivates some components included in the delay-locked loop circuit.

With the activation of the standby signal STBY in the delay-locked loop circuit of FIG. 2, the variable voltage generator 2000 provides the delay-locked loop 1000 with a bias voltage lower than the bias voltage when the standby signal STBY is deactivated. Therefore, when the semiconductor memory device operates in the standby mode, the delay-locked loop 1000 uses less power than when the semiconductor memory device operates in the active mode.

Figure 4:
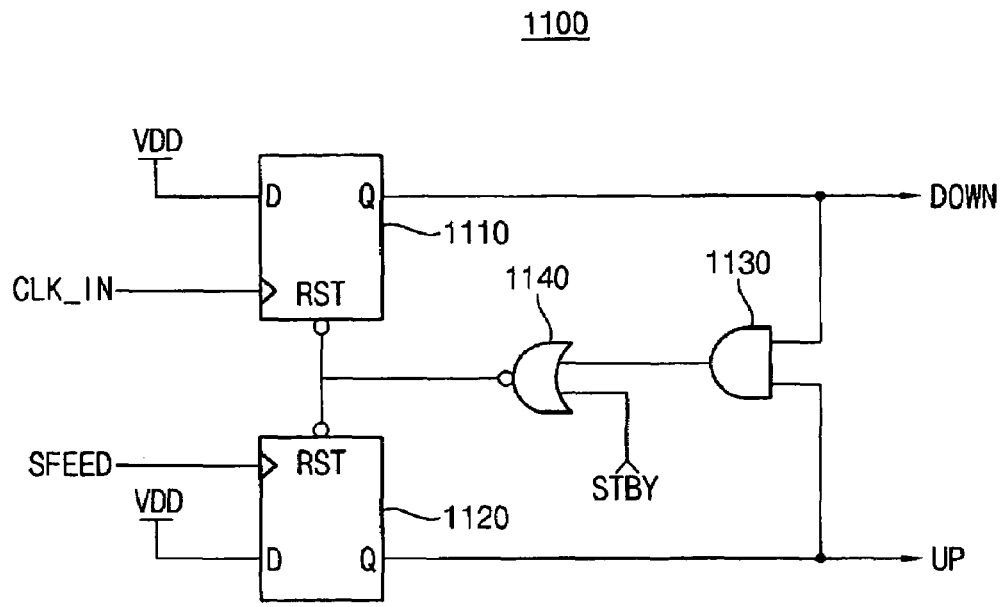
FIG. 4 is a block diagram illustrating an exemplary embodiment of a phase detector included in the delay-locked loop in FIG. 3.

FIG. 4 is a block diagram illustrating an exemplary embodiment of a phase detector illustrated in the delay-locked loop in FIG. 3. Referring to FIG. 4, the phase detector 1100 includes a first flip-flop 1110, a second flip-flop 1120, an AND gate 1130, and a NOR gate 1140.

The first flip-flop 1110 outputs data D as the down-signal DOWN in response to a front edge of the external clock signal CLK_IN. The second flip-flop 1120 outputs data D as the up-signal UP in response to a front edge of the feedback signal SFEED. The AND gate 1130 performs an AND operation on the down-signal DOWN from the first flip-flop 1110 and the up-signal UP from the second flip-flop 1120. The NOR gate 1140 performs a NOR operation on the output of the AND gate 1130 and the standby signal STBY. The first and the second flip-flops 1110 and 1120 are reset in response to a logic 'low' of an output signal of NOR gate 1140. When the standby signal STBY is activated, for example, with a logic 'high', the phase detector 1110 is reset regardless of a state of the down-signal DOWN or a state of the up-signal UP.

Figure 5:
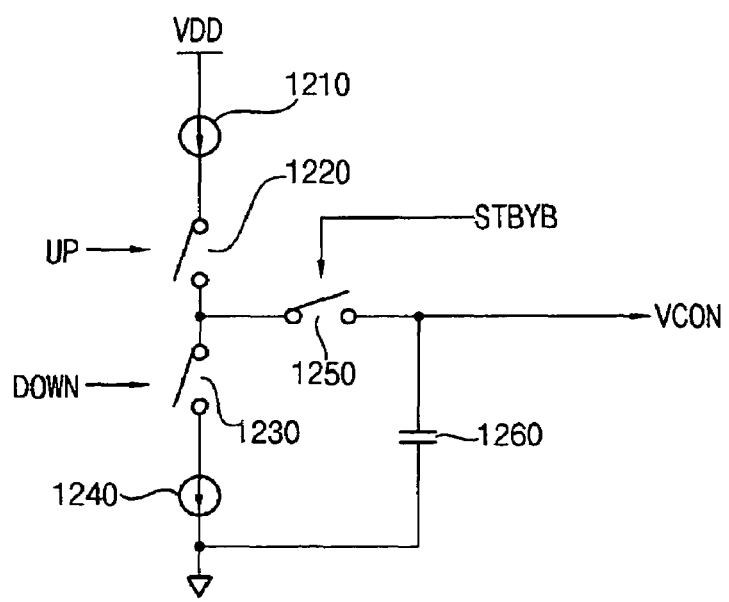
FIG. 5 is a block diagram illustrating an exemplary embodiment of a charge pump illustrated in the delay-locked loop in FIG. 3.

FIG. 5 is a block diagram illustrating an exemplary embodiment of a charge pump illustrated in the delay-locked loop in FIG. 3. Referring to FIG. 5, the charge pump 1200 includes a first current source 1210, a second current source 1240, a switch 1220 controlled by the up-signal UP, a switch 1230 controlled by the down-signal DOWN, a switch 1250 controlled by the inverted standby signal STBYB, and a capacitor 1260.

When the standby signal STBY is deactivated, that is, a logic 'low', the inverted standby signal STBYB is a logic 'high' and the switch 1250 is closed. When the standby signal STBY is deactivated and both the up-signal UP and the down-signal DOWN are a logic 'low', the delay control signal VCON is unchanged. When the standby signal STBY is activated, that is, a logic 'high', the switch 1250 is open because the inverted standby signal STBYB is a logic 'low'. The delay control signal VCON is unchanged regardless of a state of the down-signal DOWN or a state of the up-signal UP.

When the standby signal STBY is deactivated in a logic 'low' state, and the up-signal UP is a logic 'high' and the down-signal DOWN is a logic 'low', the level of the delay control signal VCON is gradually raised. When the standby signal STBY is deactivated in a logic 'low' state, and both of the up-signal UP and the down-signal DOWN are a logic 'low', the level of the delay control signal VCON is gradually lowered.

Figure 6:
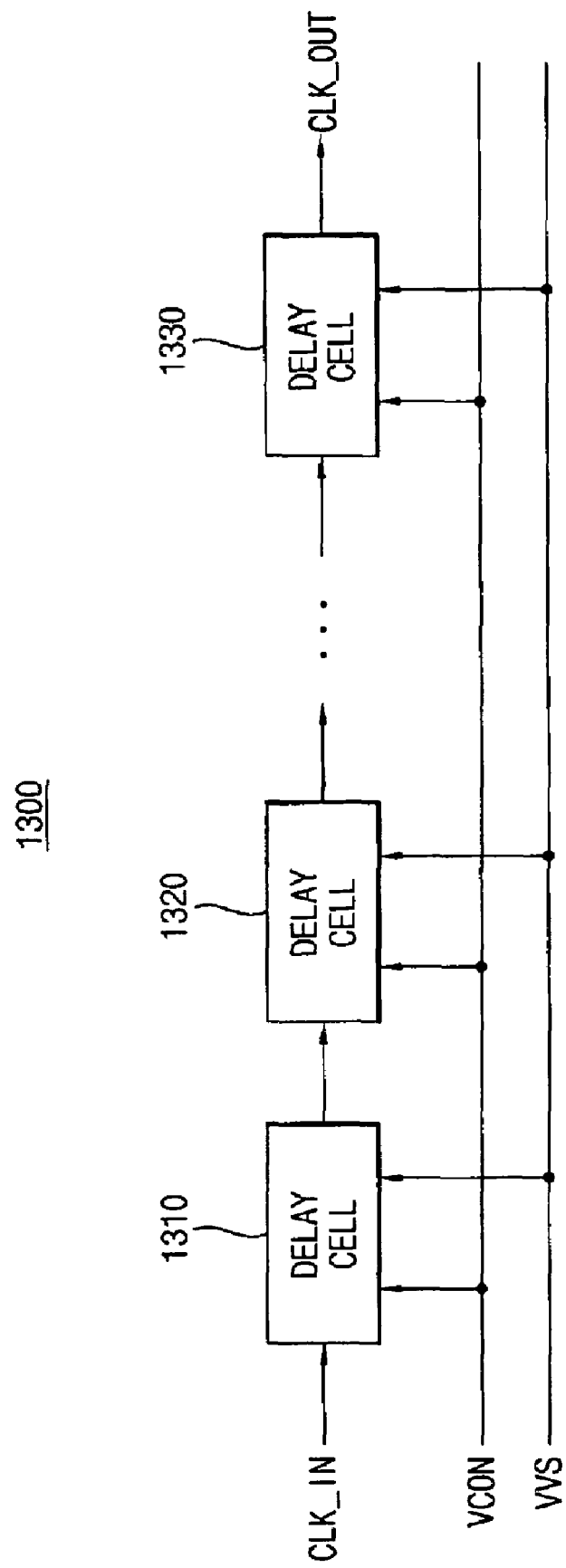
FIG. 6 is a block diagram illustrating an exemplary embodiment of a variable delay line illustrated in the delay-locked loop in FIG. 3.

FIG. 6 is a block diagram illustrating an exemplary embodiment of a variable delay line illustrated in the delay-locked loop in FIG. 3. Referring to FIG. 6, the variable delay line 1300 includes delay cells 1310, 1320, and 1330. The delay cells 1310, 1320, and 1330 are connected in cascade one after another, and the external clock signal CLK_IN is respectively delayed for a predetermined time, depending on the delay control signal VCON and the variable bias voltage signal VVS applied to each of the delay cells 1310, 1320, and 1330. An output of the variable delay line 1300 is provided as the internal clock signal CLK_OUT.

Figure 7:
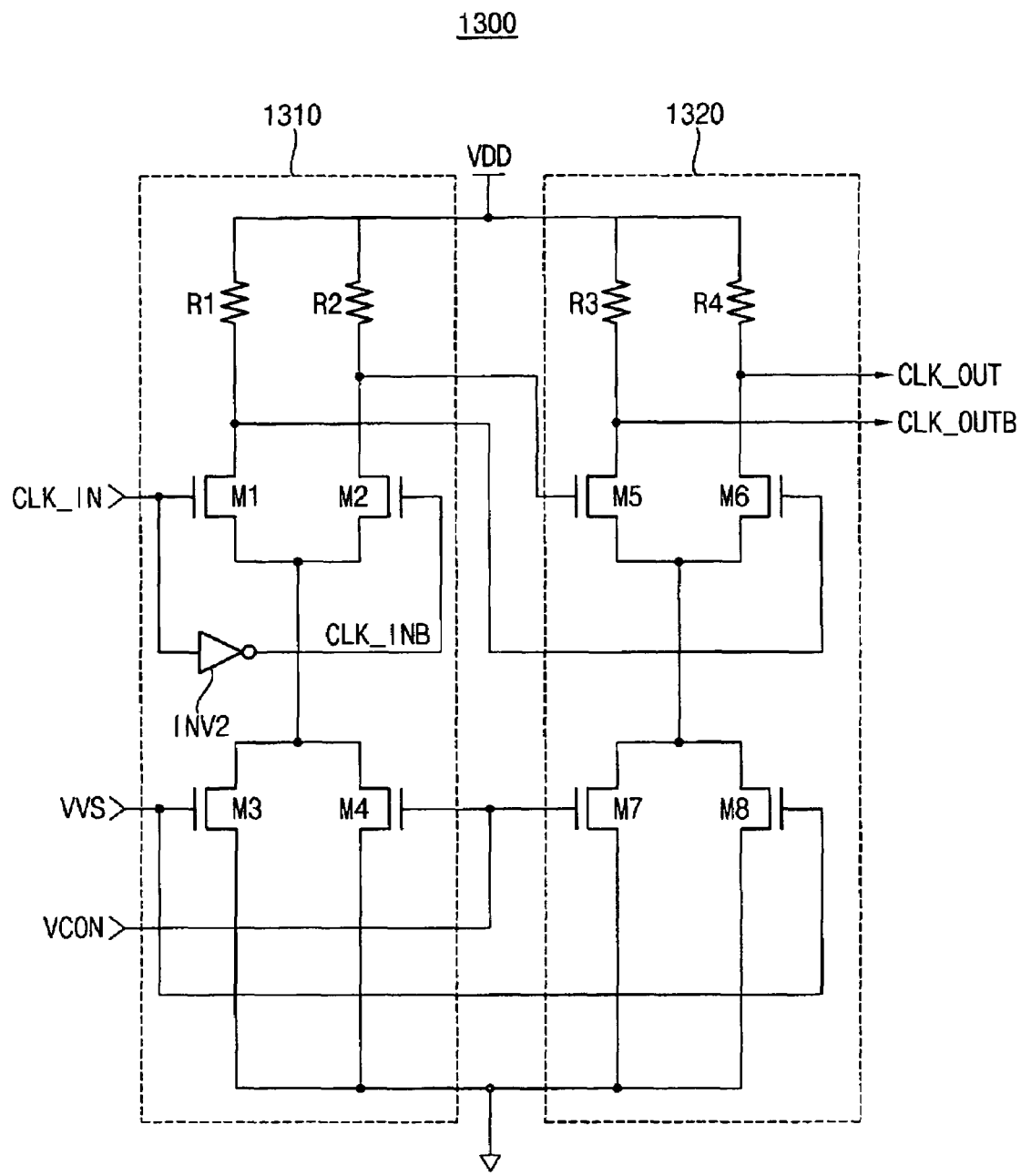
FIG. 7 is a circuit diagram illustrating an exemplary embodiment of a variable delay line illustrated in the delay-locked loop in FIG. 3.

FIG. 7 is a circuit diagram illustrating an exemplary embodiment of a variable delay line illustrated in the delay-locked loop in FIG. 3. For the sake of convenience, the variable delay line in FIG. 7 is illustrated with only two delay cells 1310 and 1320.

The delay cell 1310 includes resistors R1 and R2, NMOS transistors M1, M2, M3 and M4, and an inverter INV2. The inverter INV2 receives the external clock signal CLK_IN and outputs an inverted external clock signal CLK_INB. The NMOS transistor M1 has a gate receiving the external clock signal CLK_IN, and the NMOS transistor M2 has a gate receiving the inverted external clock signal CLK_INB. The NMOS transistors M1 and M2 have commonly coupled sources. The resistor R1 is coupled between the power supply voltage VDD and a drain of the NMOS transistor M1. The resistor R2 is coupled between the power supply voltage VDD and a drain of the NMOS transistor M2. The NMOS transistor M3 outputs a current that varies depending on the variable bias voltage signal VVS. The NMOS transistor M4 outputs a current that varies depending on the delay control signal VCON.

The delay cell 1320 includes resistors R3 and R4, and NMOS transistors M5, M6, M7 and M8. The NMOS transistor M5 has a gate receiving a voltage level of the drain of the NMOS transistor M2 of the delay cell 1310. The NMOS transistor M6 has a gate receiving a voltage level of the drain of the NMOS transistor M1 of the delay cell 1310. The NMOS transistors M5 and M6 have commonly coupled sources. The resistor R3 is coupled between the power supply voltage VDD and a drain of the NMOS transistor M5. The resistor R4 is coupled between the power supply voltage VDD and a drain of the NMOS transistor M6. The NMOS transistor M7 outputs a current that varies depending on the delay control signal VCON. The NMOS transistor M8 outputs a current that varies depending on the variable bias voltage signal VVS.

Figure 8:
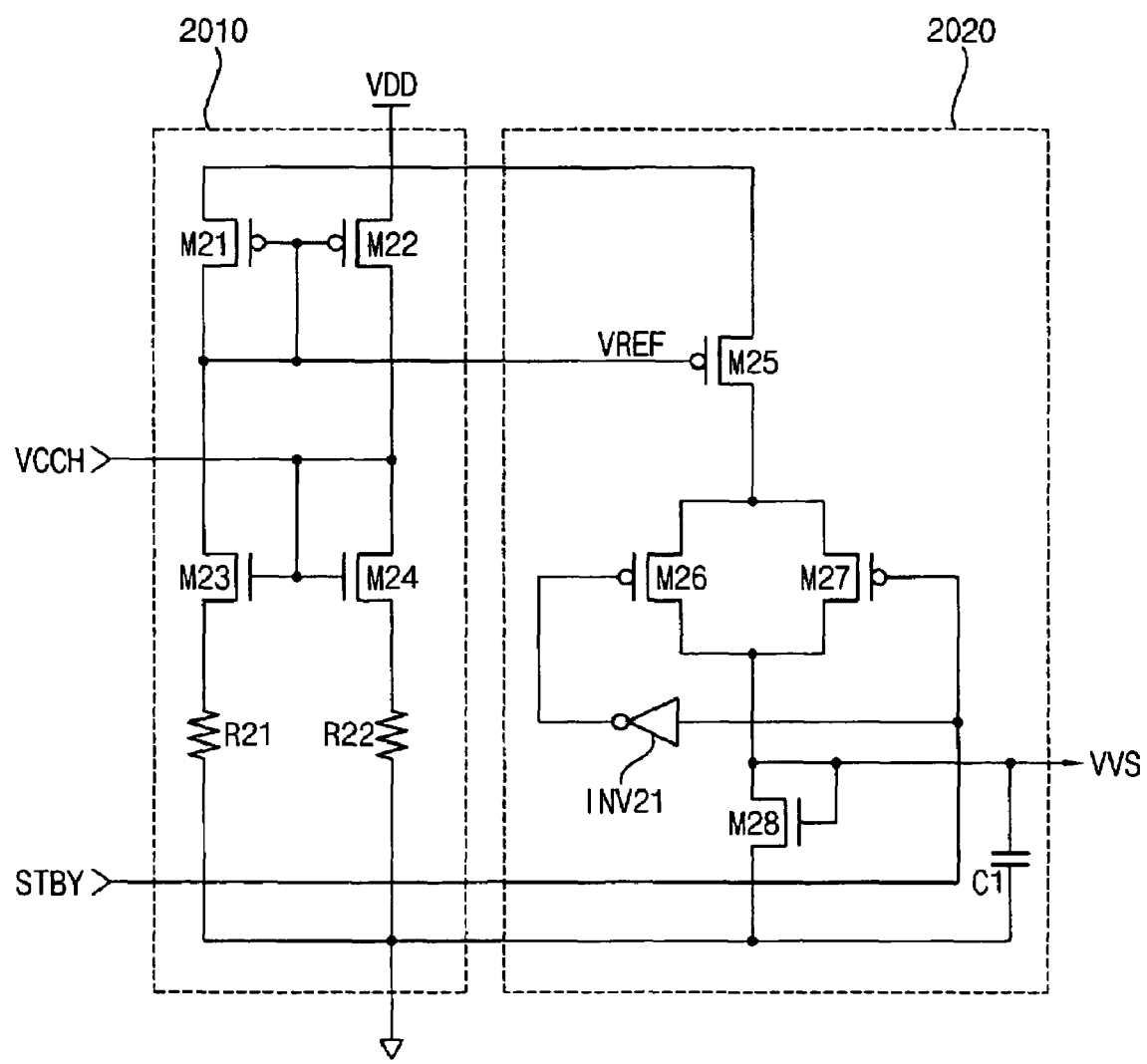
FIG. 8 is a circuit diagram illustrating an exemplary embodiment of a variable voltage generator illustrated in the delay-locked loop circuit in FIG. 2.

FIG. 8 is a circuit diagram illustrating an exemplary embodiment of a variable voltage generator illustrated in the delay-locked loop circuit in FIG. 2.

Referring to FIG. 8, the variable voltage generator 2000 includes a reference voltage generating unit 2010 and a driving unit 2020. The reference voltage generating unit 2010 generates a reference voltage VREF. The driving unit 2020 generates the variable bias voltage signal VVS, which has various voltage levels according to the operation modes of the semiconductor memory device, based on the reference voltage VREF and in response to the standby signal STBY.

The reference voltage generator 2010 includes PMOS transistors M21 and M22, NMOS transistors M23 and M24, and resistors R21 and R22. The PMOS transistor M21 has a source connected to the power supply voltage VDD, a drain providing the reference voltage VREF, and a gate commonly connected to the drain. The PMOS transistor M22 has a source connected to the power supply voltage VDD, and a gate connected to the gate of the PMOS transistor M21. The NMOS transistor M24 has a drain connected to a drain of the PMOS transistor M22, and a gate commonly connected to the drain. The NMOS transistor M23 has a drain connected to the drain of the PMOS transistor M21, and a gate connected to the gate of the NMOS transistor M24. The resistor R21 is coupled between the drain of the NMOS transistor M23 and a ground or a second power supply voltage. The resistor R22 is coupled between the drain of the NMOS transistor M24 and the ground or the second power supply voltage. The gates of the NMOS transistors M23 and M24 may be provided with the power-up signal VCCH.

The driving unit 2020 includes PMOS transistors M25, M26 and M27, an NMOS transistor M28, and an inverter INV21. The inverter INV21 receives the standby signal STBY and inverts the standby signal STBY. The PMOS transistor M25 has a gate provided with the reference voltage VREF and a source provided with the power supply voltage VDD. The PMOS transistor M27 has a gate receiving the standby signal STBY, a source connected to a drain of the PMOS transistor M25, and a drain providing the variable bias voltage signal VVS. The PMOS transistor M26 has a gate receiving an output of the inverter INV21, a source connected to the drain of the PMOS transistor M25, and a drain providing the variable bias voltage signal VVS. The NMOS transistor M28 has a drain commonly connected to the drain of the PMOS transistor M26 and the drain of the PMOS transistor M27, and a gate connected to the drain, and a source connected to a ground or a second power supply voltage. The driving unit 2020 may further include a capacitor C1 for regulating the variable bias voltage signal VVS.

The reference voltage generating unit 2010 generates the reference voltage VREF, and is initialized by the power-up signal VCCH. In the driving unit 2020, a current flowing via the PMOS transistor M25 is determined based on the reference voltage VREF.

The standby signal is activated while the semiconductor memory device operates in the standby mode as the power-down mode or the self-refresh mode. For example, the standby signal STBY transitions to a logic 'high', and the inverted standby signal STBYB transitions to a logic 'low'. Then, the PMOS transistor M27 is disabled and the PMOS transistor M26 is enabled.

The standby signal is deactivated while the semiconductor memory device operates in the active mode. For example, the standby signal STBY transitions to a logic 'low', and the inverted standby signal STBYB transitions to a logic 'high'. Then, the PMOS transistor M27 is enabled and the PMOS transistor M26 is disabled.

Because the semiconductor memory device needs much less current to operate in the standby mode than in the active mode, the size (width-to-length ratio, or W/L ratio) of the PMOS transistor M26 may be much smaller than that of the PMOS transistor M27. For example, the size of the PMOS transistor M27 may be twenty times as large as the size of the PMOS transistor M26.

Therefore, the variable voltage generator 2000 in FIG. 8 may generate a variable bias voltage signal VVS that has different voltage levels according to the operation mode of the semiconductor memory device. The variable voltage generator 2000 may be initialized by the power-up signal VCCH.

Figure 9:
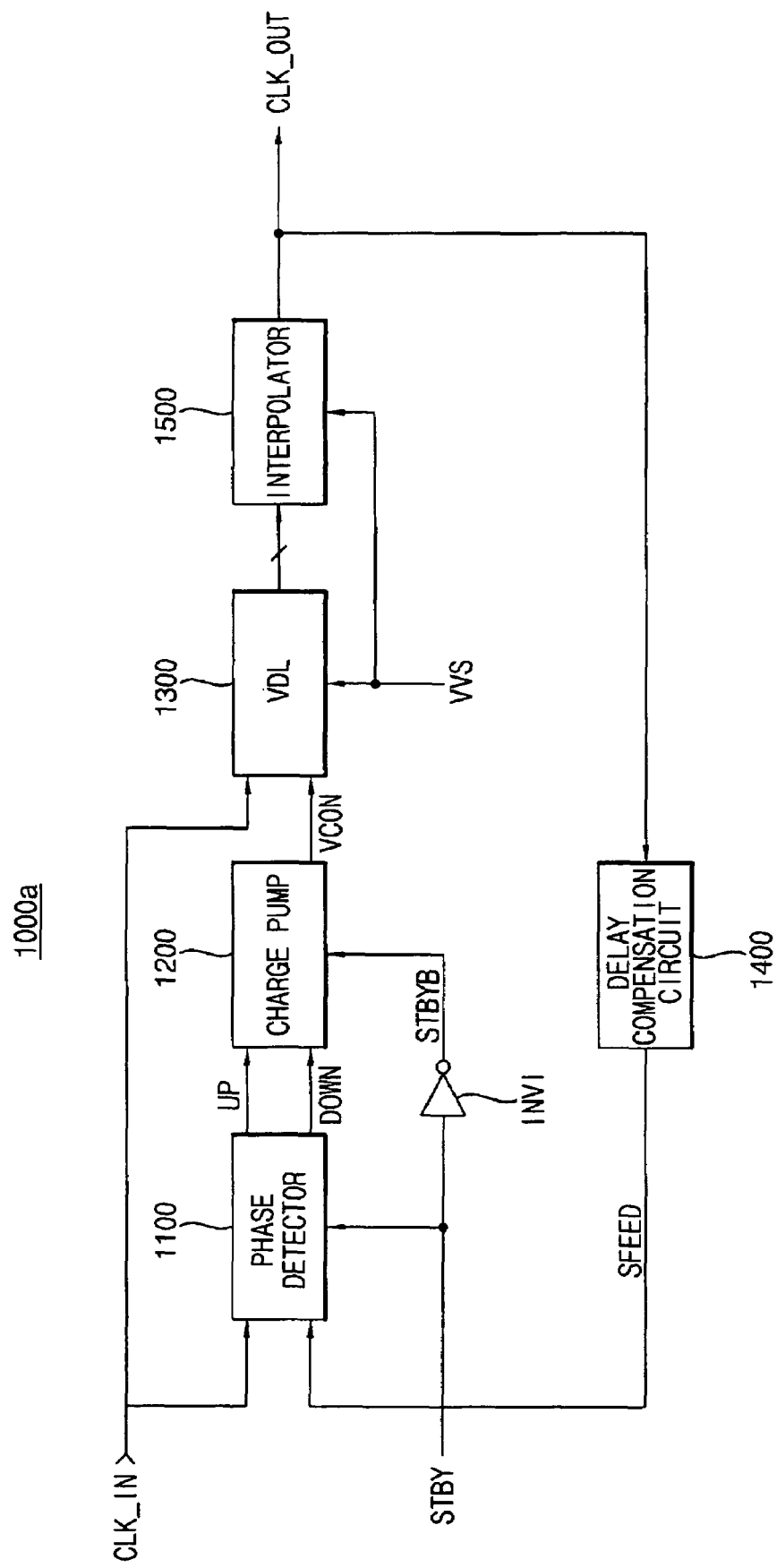
FIG. 9 is a block diagram illustrating a delay-locked loop according to an exemplary embodiment of the present invention.

FIG. 9 is a block diagram illustrating a delay-locked loop according to an exemplary embodiment of the invention. A delay-locked loop 1000a in FIG. 9 further includes an interpolator 1500 as compared with the delay-locked loop 1000 in FIG. 3. The interpolator 1500 interpolates two adjacent output signals that are selected among a plurality of output signals of the variable delay line (VDL) 1300 in response to the variable bias voltage signal VVS, so as to generate the internal clock signal CLK_OUT. When a semiconductor memory device operates in the standby mode, the interpolator 1500 also operates in the standby mode in response to the variable bias voltage signal VVS, thereby using much less power than in the active mode.

Although the exemplary embodiments of the present invention have been described, it is understood that the present invention should not be construed as limited to these exemplary embodiments but various changes and modifications can be made by one ordinary skilled in the art within the spirit and scope of the present invention as hereinafter claimed.

What is claimed is:

1. A delay-locked loop circuit comprising:
   a variable voltage generator configured to generate a variable bias voltage signal in response to a standby signal, wherein the variable bias voltage signal has differing voltage levels according to operation modes, wherein the operation modes include a standby mode and an active mode; and
   a delay-locked loop configured to generate an internal clock signal in response to the standby signal and the variable bias voltage signal, wherein the internal clock signal is synchronized with an external clock signal and the variable voltage generator comprises:
      a reference voltage generating unit configured to generate a reference voltage; and
      a driving unit configured to generate the variable bias voltage signal in response to the reference voltage and the standby signal, wherein the driving unit comprises:
         a first current driving transistor that operates in response to the standby signal; and
         a second current driving transistor that is activated in response to a complementary standby signal, wherein one of the first and the second current driving transistors is smaller than the other, the smaller sized current driving transistor being activated in the standby mode, and the larger sized current driving transistor being activated in the active mode.

2. The delay-locked loop circuit of claim 1, wherein the variable voltage generator is initialized by a power-on reset (POR) signal.

3. The delay-locked loop circuit of claim 1, wherein the reference voltage generating unit comprises:
   a first PMOS transistor having a source coupled to a first power supply voltage, a drain providing the reference voltage, and a gate coupled to the drain of the first PMOS transistor;
   a second PMOS transistor having a source coupled to the first power supply voltage, and a gate coupled to the gate of the first PMOS transistor;
   a first NMOS transistor having a source coupled to the drain of the second PMOS transistor and a gate coupled to the source of the first NMOS transistor;
   a second NMOS transistor having a source coupled to the drain of the first PMOS transistor and a gate coupled to the gate of the first NMOS transistor;
   a first resistor coupled between the drain of the second NMOS transistor and a second power supply voltage; and
   a second resistor coupled between the drain of the first NMOS transistor and the second power supply voltage.

4. The delay-locked loop circuit of claim 1, wherein the first and the second current driving transistors respectively have current driving capabilities different from each other.

5. The delay-locked loop circuit of claim 4, wherein the first and the second current driving transistors differ in size from each other.

6. The delay-locked loop circuit of claim 1, wherein the driving unit comprises:
   an inverter for inverting the standby signal;
   a first PMOS transistor having a gate to receive the reference voltage and a source to which a first power supply voltage is applied;
   a second PMOS transistor having a gate to receive the standby signal, and a source coupled to a drain of the first PMOS transistor, and a drain to provide the variable bias voltage signal;
   a third PMOS transistor having a gate to receive an output of the inverter, a source coupled to the drain of the first PMOS transistor, and a drain to provide the variable bias voltage signal; and
   a first NMOS transistor having a source commonly coupled to both the drain of the third PMOS transistor and the drain of the second PMOS transistor, a drain coupled to a second power supply voltage, and a gate coupled to the source of the first NMOS transistor.

7. The delay-locked loop circuit of claim 6, wherein the driving unit further comprises a capacitor for regulating the variable bias voltage signal.

8. The delay-locked loop circuit of claim 1, wherein the delay-locked loop comprises:
   a phase detector configured to detect a phase difference between the external clock signal and the internal clock signal in response to the standby signal to generate an up-down signal corresponding to the phase difference;
   a charge pump configured to generate a delay control signal in response to the up-down signal and the standby signal; and
   a variable delay line configured to generate the internal clock signal depending on the variable bias voltage signal in response to the external clock signal and the delay control signal.

9. The delay-locked loop circuit of claim 8, wherein the delay-locked loop further comprises a delay compensation circuit configured to compensate for a phase delay of the internal clock signal, and configured to generate a feedback signal corresponding to an amount of the compensation of the phase delay to provide the feedback signal to the phase detector.

10. The delay-locked loop circuit of claim 8, wherein the delay-locked loop further comprises an interpolator configured to interpolate two adjacent clock signals that are selected among a plurality of output clock signals of the variable delay line in response to the variable bias voltage signal, and configured to generate the interpolated signal as the internal clock signal.

11. The delay-locked loop circuit of claim 10, wherein the interpolator uses less power in the standby mode than in the active mode.

12. The delay-locked loop circuit of claim 1, wherein the standby mode includes a power-down mode and a self-refresh mode in which at least one component in the delay-locked loop is deactivated.

13. A semiconductor memory device comprising:
a variable voltage generator configured to generate a variable bias voltage signal, wherein the variable voltage generator sets the variable bias voltage signal to a standby voltage level in response to a standby signal being enabled and to an active voltage level in response to the standby signal being disabled; and
a delay-locked loop configured to generate an internal clock signal in response to the standby signal and the variable bias voltage signal, the internal clock signal being synchronized with an external clock signal,
wherein the standby voltage level is less than the active voltage level and,
the variable voltage generator comprises:
a reference voltage generating unit configured to generate a reference voltage; and
a driving unit configured to generate the variable bias voltage signal in response to the reference voltage and the standby signal, wherein the driving unit comprises:
a first current driving transistor that operates in response to the standby signal; and
a second current driving transistor that is activated in response to a complementary standby signal, wherein one of the first and second current driving transistors is smaller than the other, the smaller sized current driving transistor being activated in response to the standby signal, and the larger sized current driving transistor being activated in response to the complementary standby signal.

14. The semiconductor memory device of claim 13, wherein the phase detector is configured to detect a phase difference between the external clock signal and the internal clock signal when standby signal is disabled to generate an up-down signal corresponding to the phase difference and the delay-locked loop further comprises:
a charge pump configured to generate a delay control signal in response to the up-down signal and the standby signal;
a plurality of variable delay lines configured to respectively generate output clock signals depending on the variable bias voltage signal in response to the external clock signal and the delay control signal; and
an interpolator configured to interpolate two adjacent clock signals that are selected from the output clock signals and generate the interpolated signal as the internal clock signal.

15. The semiconductor memory device of claim 13, wherein the delay-locked loop includes a phase detector receiving the internal clock signal, the external clock signal and the standby signal, and wherein the phase detector is deactivated when the standby signal is enabled.

16. A method of clock synchronization for a semiconductor memory device, the method comprising:
generating a variable bias voltage signal from a variable voltage generator, wherein the variable voltage generator sets the variable bias voltage signal to a standby voltage level in response to a standby signal being enabled and to an active voltage level in response to the standby signal being disabled; and
generating an internal clock signal from a delay-locked loop in response to the standby signal and the variable bias voltage signal, the internal clock signal being synchronized with an external clock signal, wherein generating the variable bias voltage signal comprises:
generating a reference voltage; and
generating the variable bias voltage signal in response to the reference voltage and the standby signal, wherein generating the variable bias voltage signal comprises:
activating a first current transistor that operates in response to the standby signal; and
activating a second current transistor that is activated in response to a complimentary standby signal, wherein one of the first and second current transistors is smaller than the other and activating the first and second current transistors comprises:
activating the smaller sized current transistor in response to the standby signal; and
activating the larger sized current transistor in response to the complimentary standby signal.

17. The method of claim 16, wherein generating the internal clock signal further comprises:
generating a delay control signal in response to the up-down signal and the standby signal;
generating output clock signals depending on the variable bias voltage signal in response to the external clock signal and the delay control signal; and
interpolating two adjacent clock signals that are selected from the output clock signals to generate the interpolated signal as the internal clock signal.

18. The method of claim 16, wherein generating the internal clock signal comprises:
receiving the internal clock signal, the external clock signal and the standby signal by a phase detector; and
generating an up-down signal by the phase detector indicating a phase difference between the external clock signal and the internal clock signal when the standby signal is disabled.

* * * * *